United States Patent
Chae et al.

(10) Patent No.: US 12,176,511 B2
(45) Date of Patent: Dec. 24, 2024

(54) METHOD FOR MANUFACTURING ANODE FOR LITHIUM SECONDARY BATTERY

(71) Applicant: LG ENERGY SOLUTION, LTD., Seoul (KR)

(72) Inventors: Ohbyong Chae, Daejeon (KR); Yoonah Kang, Daejeon (KR); Junhyuk Song, Daejeon (KR); Eun Kyung Kim, Daejeon (KR); Sangwook Woo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/498,797

(22) Filed: Oct. 31, 2023

(65) Prior Publication Data
US 2024/0063363 A1    Feb. 22, 2024

Related U.S. Application Data

(63) Continuation of application No. 16/464,564, filed as application No. PCT/KR2018/004884 on Apr. 26, 2018, now Pat. No. 11,843,104.

(30) Foreign Application Priority Data

May 18, 2017  (KR) .................... 10-2017-0061657
Apr. 25, 2018  (KR) .................... 10-2018-0047880

(51) Int. Cl.
*H01M 4/04*    (2006.01)
*B05D 1/32*    (2006.01)
(Continued)

(52) U.S. Cl.
CPC ............ *H01M 4/0421* (2013.01); *B05D 1/32* (2013.01); *C23C 14/04* (2013.01); *C23C 16/04* (2013.01);
(Continued)

(58) Field of Classification Search
CPC .................................................. H01M 4/134
See application file for complete search history.

(56) References Cited

U.S. PATENT DOCUMENTS 6,210,836 B1    4/2001  Takada et al.
2002/0187398 A1   12/2002  Mikhaylik et al.
(Continued)

FOREIGN PATENT DOCUMENTS

CN    103531815 A    1/2014
CN    105633338 A    6/2016
(Continued)

OTHER PUBLICATIONS

Fan et al., "Influence of electrolytic etching current collector Cu foil on the performance of anode", Battery Bimonthly, vol. 39, No. 3, Jun. 2009, pp. 131-134, with English abstract.
(Continued)

*Primary Examiner* — Austin Murata
(74) *Attorney, Agent, or Firm* — Birch, Stewart, Kolasch & Birch, LLP (57) ABSTRACT

A method for manufacturing a negative electrode for a lithium secondary battery including a patterned lithium metal that homogenizes the electron distribution in the lithium electrode and prevents the growth of the lithium dendrites when driving the lithium secondary battery.

6 Claims, 7 Drawing Sheets

(51) Int. Cl.

| | |
|---|---|
| *C23C 14/04* | (2006.01) |
| *C23C 16/04* | (2006.01) |
| *H01M 4/134* | (2010.01) |
| *H01M 4/1395* | (2010.01) |
| *H01M 4/38* | (2006.01) |
| *H01M 4/66* | (2006.01) |
| *H01M 10/04* | (2006.01) |
| *H01M 10/052* | (2010.01) |
| *H01M 10/058* | (2010.01) |
| *H01M 4/02* | (2006.01) |

(52) U.S. Cl.
CPC ......... *H01M 4/134* (2013.01); *H01M 4/1395* (2013.01); *H01M 4/382* (2013.01); *H01M 4/661* (2013.01); *H01M 10/04* (2013.01); *H01M 10/052* (2013.01); *H01M 10/058* (2013.01); *H01M 2004/021* (2013.01); *H01M 2004/027* (2013.01)

(56) References Cited

U.S. PATENT DOCUMENTS

| | | |
|---|---|---|
| 2005/0008778 A1 | 1/2005 | Utsugi et al. |
| 2005/0037916 A1 | 2/2005 | Chen et al. |
| 2005/0079418 A1 | 4/2005 | Kelley et al. |
| 2006/0110661 A1 | 5/2006 | Lee et al. |
| 2008/0020271 A1 | 1/2008 | Sato et al. |
| 2012/0070734 A1 | 3/2012 | Uetani et al. |
| 2012/0116028 A1 | 5/2012 | Ueno et al. |
| 2012/0321815 A1 | 12/2012 | Song et al. |
| 2013/0017340 A1 | 1/2013 | Brown et al. |
| 2014/0308578 A1 | 10/2014 | Onizuka et al. |
| 2015/0318530 A1 | 11/2015 | Yushin et al. |
| 2017/0324113 A1* | 11/2017 | Mayer ............... H01M 4/1395 |
| 2018/0115021 A1 | 4/2018 | Lee et al. |

FOREIGN PATENT DOCUMENTS

| | | |
|---|---|---|
| JP | 8-223820 A | 8/1994 |
| JP | 2013229315 A | 11/2013 |
| KR | 10-0582557 B1 | 5/2006 |
| KR | 10-2013-0013990 A | 2/2013 |
| KR | 10-2013-0067920 A | 6/2013 |
| KR | 10-2013-0122578 A | 11/2013 |
| KR | 10-2014-0073924 A | 6/2014 |
| KR | 10-1484845 B1 | 1/2015 |
| KR | 10-2017-0014216 A | 2/2017 |

OTHER PUBLICATIONS

International Search Report (PCT/ISA/210) issued in PCT/KR2018/004884, mailed on Aug. 24, 2018.

Tang et al. "Binary Iron Sulfide as a Low-Cost and High-Performance Anode for Lithium-/Sodium-Ion Batteries", ACS Applied Materials & Interfaces, pp. 52888-52898, 2020.

* cited by examiner

METHOD FOR MANUFACTURING ANODE FOR LITHIUM SECONDARY BATTERY

CROSS-REFERENCE TO RELATED APPLICATIONS

This application is a Continuation of application Ser. No. 16/464,564, filed on May 28, 2019, which is the National Phase under 35 U.S.C. § 371 of International Application No. PCT/KR2018/004884, filed on Apr. 26, 2018, which claims priority under 35 U.S.C. § 119(a) to Application No. 10-2017-0061657, filed in Korea on May 18, 2017 and Application No. 10-2018-0047880, filed in Korea on Apr. 25, 2018, all of which are hereby expressly incorporated by reference into the present application.

TECHNICAL FIELD

The present invention relates to a method for manufacturing a negative electrode for a lithium secondary battery comprising a patterned lithium metal.

BACKGROUND ART

Recently, there is increasing interest in energy storage technology. As the application area thereof extends to the energy for mobile phones, camcorders, notebook PC, and even electric vehicles, the effort of research and development of electrochemical devices is being carried out more and more concretely.

Electrochemical devices are the most noteworthy area in this respect, and among them, the development of a secondary battery capable of charging/discharging is the focus of attention. Recently, in developing these batteries, research and development on the design of new electrodes and batteries have been conducted in order to improve capacity density and energy efficiency.

Among the secondary batteries currently being applied, the lithium secondary batteries developed in the early 1990s are attracting much attention as there is an advantage in that it has much higher operating voltage and energy density than conventional batteries such as Ni-MH, Ni—Cd, and sulfuric acid-lead batteries using an electrolyte solution in the form of an aqueous solution.

In general, the lithium secondary battery is constructed by embedding an electrode assembly including a positive electrode, a negative electrode, and a separator interposed between the positive electrode and the negative electrode into the battery case as a lamination or winding structure and injecting a non-aqueous electrolyte solution into the battery.

A lithium electrode as a negative electrode is formed by attaching a lithium foil on a planar current collector. In this case, as the charging/discharging is repeated, the formation and removal of lithium are irregular, thereby forming lithium dendrites, which lead to a continuous capacity drop.

In order to solve this problem, studies on the introduction of a polymer protective layer or an inorganic solid protective layer into the lithium metal layer, the increase of salt concentration in electrolyte solution or the application of appropriate additives have been conducted. However, the inhibitory effect of lithium dendrites in these studies is insufficient. Therefore, solving the problem by modifying the lithium metal negative electrode itself or modifying the battery structure may be an effective alternative.

Prior Art Documents (Patent Document 1) Korean Patent Laid-Open Publication No. 2017-0014216, "Patterning Lithium Electrode and Method for Manufacturing thereof and Lithium Secondary Battery using the same."

DISCLOSURE

Technical Problem

As described above, since the reversibility of the lithium metal, which is a negative electrode of the lithium secondary battery, is reduced during the charging/discharging, the lithium metal needs to be dispersed so that the current density is not concentrated in one place. Thus, the present inventors confirmed that if the lithium metal is patterned and deposited, the reversibility is improved, and thus completed the present invention.

Therefore, it is an object of the present invention is to provide a method of manufacturing a negative electrode for a lithium secondary battery with improved cell performance by improving the reversibility of the lithium metal through the modification of the shape and structure of the electrode and furthermore, solving the problem of the volumetric expansion of the cell due to the lithium dendrites.

Technical Solution

To achieve the above object, the present invention provides a method for manufacturing a negative electrode for a lithium secondary battery comprising the steps of i) forming a lithium substrate layer on one or both sides of a current collector; ii) placing a shadow mask having at least one opening on the lithium substrate layer and forming a lithium pattern layer on the lithium substrate layer through the at least one opening of the shadow mask; and iii) removing the shadow mask to expose the lithium pattern layer formed on the lithium substrate layer.

Advantageous Effects

The negative electrode for the lithium secondary battery according to the present invention can improve the safety of the lithium secondary battery by homogenizing the electron distribution in the lithium electrode and thus preventing the growth of the lithium dendrites when driving the lithium secondary battery. In addition, the volumetric expansion of the battery can be prevented by inducing the formation of the lithium dendrites into the void formed by the patterning of the lithium metal.

BEST MODE

Hereinafter, the present invention will be described in detail with reference to the accompanying drawings so that those skilled in the art can easily carry out the present invention. However, the present invention can be embodied in various different forms and is not limited thereto.

In the drawings, parts not related to the description are omitted in order to clearly illustrate the present invention, and similar reference numerals are used for similar portions throughout the specification. Also, the size and relative size of the components shown in the figure are independent of the actual scale and may be reduced or exaggerated for clarity of description.

Figure 1:
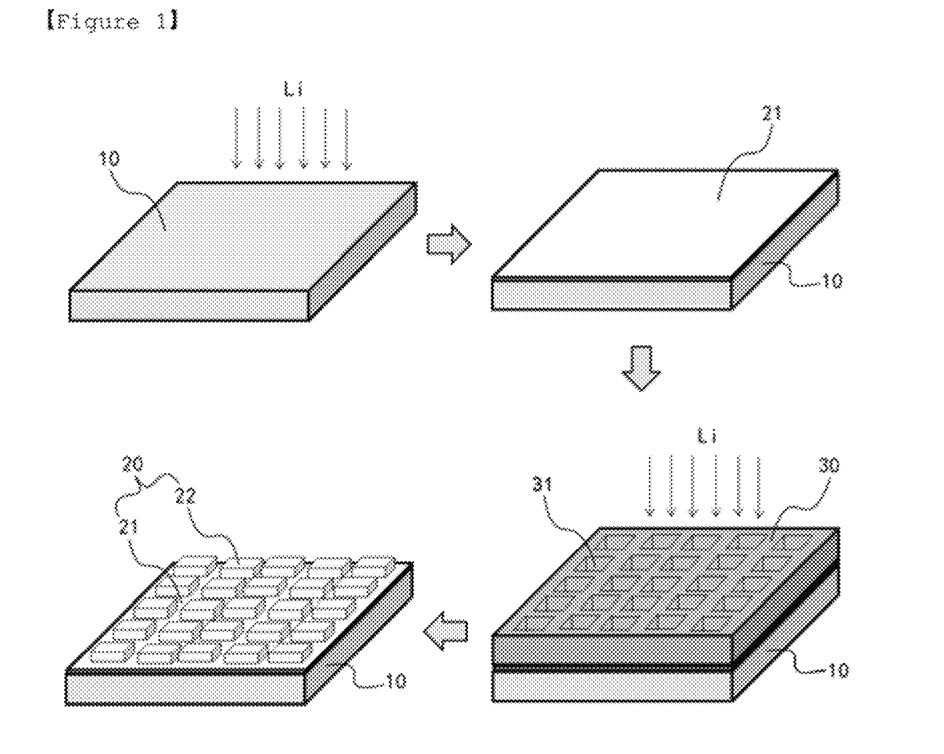
FIG. 1 is a conceptual diagram illustrating a method of manufacturing a negative electrode for a lithium secondary battery according to the present invention.
Figure 2:
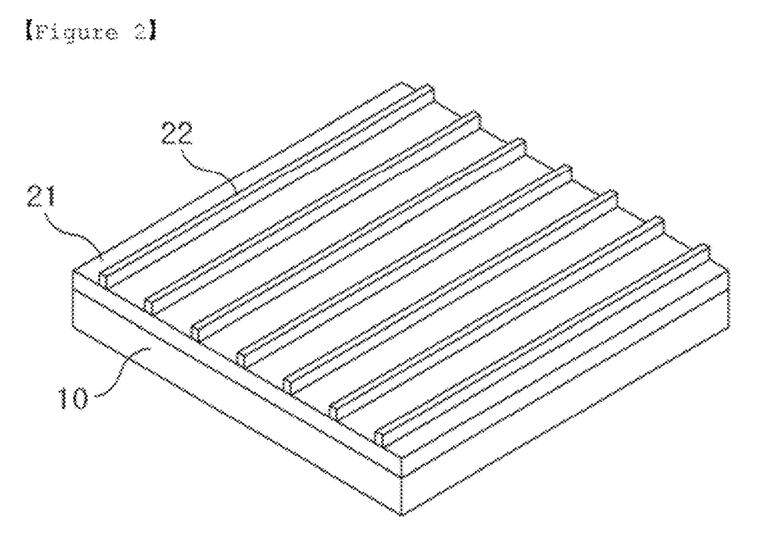
FIG. 2 is an example of a pattern applicable to a negative electrode for a lithium secondary battery of the present invention.
Figure 3:
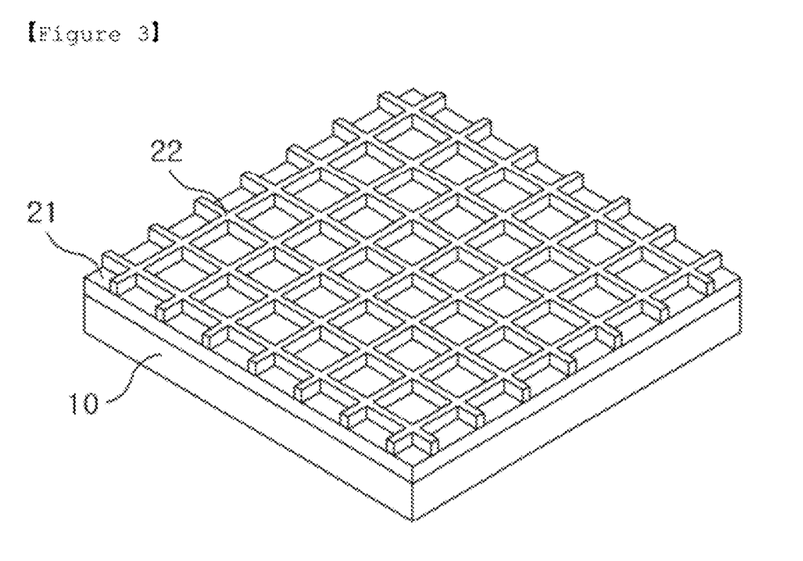
FIG. 3 is an example of a pattern applicable to a negative electrode for a lithium secondary battery of the present invention.
Figure 4:
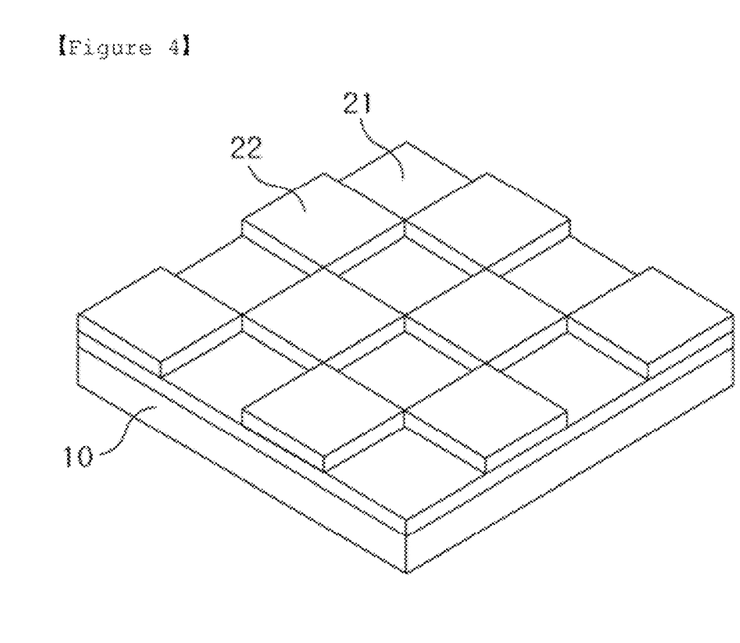
FIG. 4 is an example of a pattern applicable to a negative electrode for a lithium secondary battery of the present invention.
Figure 5:
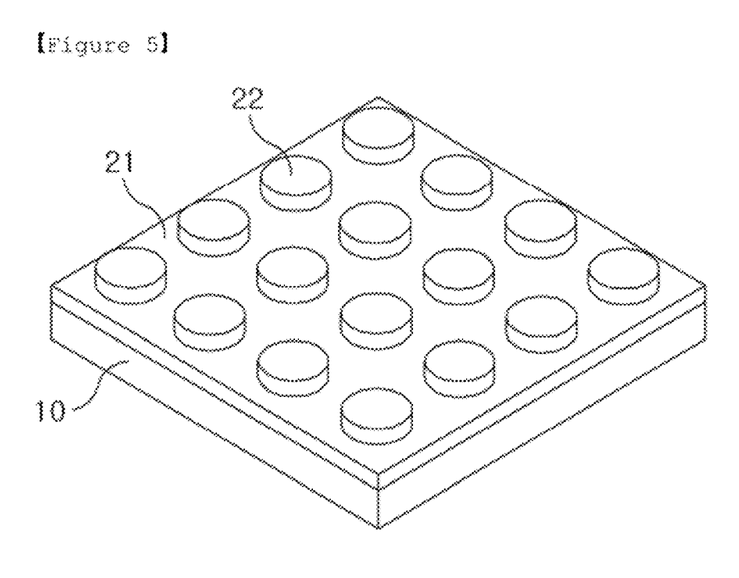
FIG. 5 is an example of a pattern applicable to a negative electrode for a lithium secondary battery of the present invention.
Figure 6:
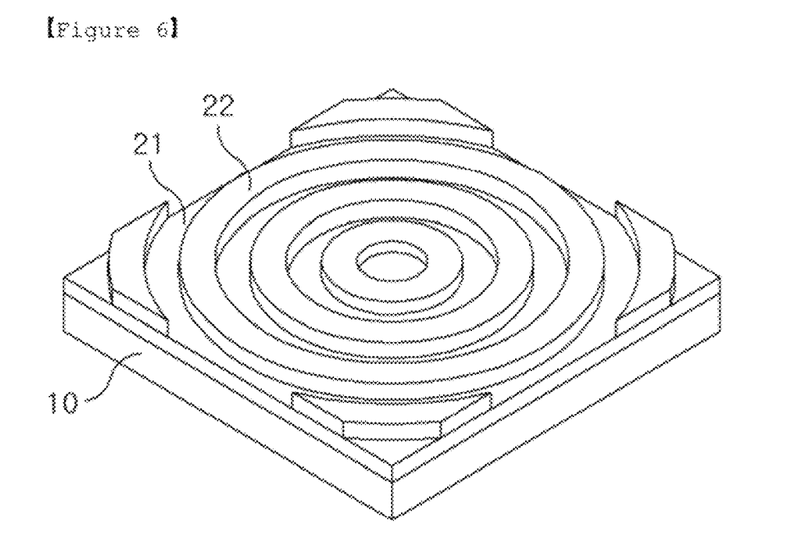
FIG. 6 is an example of a pattern applicable to a negative electrode for a lithium secondary battery of the present invention.
Figure 7:
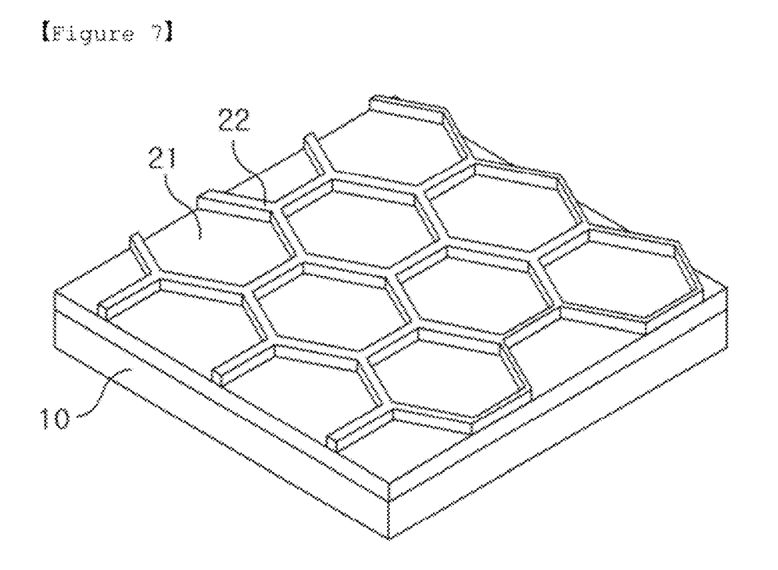
FIG. 7 is an example of a pattern applicable to a negative electrode for a lithium secondary battery of the present invention.

FIG. 1 is a conceptual diagram illustrating a method of manufacturing a negative electrode for a lithium secondary battery according to the present invention. Referring to FIG. 1, the present invention provides a method for manufacturing a negative electrode for a lithium secondary battery comprising the steps of i) forming a lithium substrate layer 21 on one or both sides of a current collector 10; ii) forming a lithium pattern layer 22 on the lithium substrate layer 21 using a shadow mask 30; and iii) removing the shadow mask 30.

According to the present invention, the lithium electrode 20 having a predetermined pattern can be formed using the shadow mask 30 having a plurality of openings 31, and the shape and size of the pattern can be determined depending on the shape and size of the opening 31.

A method of patterning the lithium electrode 20, more specifically, a method of forming the lithium pattern layer 22 by depositing lithium on the lithium substrate layer 21 using the shadow mask can freely form the patterning of various shapes and sizes as compared with the method of forming an engrave by the pressing. If the lithium electrode 20 is thus patterned, the diffusion path of the lithium ion is improved so that the electrons in the lithium electrode 20 can be uniformly distributed. Also, by homogenizing the local reactions occurring on the surface of the lithium metal to lower the surface unevenness, it has the effect of inhibiting the growth of lithium dendrites and improving the efficiency of the lithium electrode 20. That is, the current distribution in the electrode becomes uniform, and at the same time, the current density can be reduced and thus the growth of the lithium dendrites can be suppressed.

Hereinafter, the method for manufacturing the negative electrode for the lithium secondary battery according to the present invention will be described in detail for each step.

In step i), the lithium substrate layer may be formed on one or both sides of the current collector.

First, the current collector 10 is prepared.

The current collector 10 is not particularly limited as long as it has high electrical conductivity without causing chemical change in the battery. For example, the current collector 10 may be selected from the group consisting of copper, aluminum, stainless steel, zinc, titanium, silver, palladium, nickel, iron, chromium, alloys thereof and combinations thereof. The stainless steel may be surface-treated with carbon, nickel, titanium or silver, the alloy may be an aluminum-cadmium alloy, and additionally, a nonconductive polymer, which was surface-treated with a sintered carbon or a conductive material, or a conductive polymer may be used. In general, the thin plate of copper can be used as a negative electrode current collector.

The current collector 10 generally has a thickness in the range of 3 μm to 500 μm. If the thickness of the current collector 10 is less than 3 μm, the current collecting effect is lowered. On the other hand, if the thickness exceeds 500 μm, when the cells are folded and then assembled, there is a problem that the processability is lowered.

Next, the lithium substrate layer 21 is formed on the entire surface of the current collector 10. The lithium substrate layer 21 comprises lithium and may specifically be a lithium containing metal compound comprising a metal selected from the group consisting of S, P, O, Cl, Se, F, Br, I, and combinations thereof. In addition, it may further comprise an element selected from the group consisting of Ni, Co, Cu, Zn, Ga, Ge, Si, Al, Fe, V, Mn, Ti, Mo, Cr, Nb, Pt, and combinations thereof.

It is preferable that the sum of the amounts of the remaining elements other than lithium in the lithium-containing metal compound is combined in the range of about 5 wt. % to about 20 wt. % based on the total weight of the negative electrode active material. There is no limitation on the combination method, and for example, it is possible to apply the alloy in a suitable ratio or also to form a film on the current collector 10 in the form of a metal powder.

Such a lithium-containing metal compound is added to compensate for the irreversible capacity of the lithium metal and may be added in an amount corresponding to the theoretical capacity of the positive electrode active material described later, or may be added in excess of that, wherein these excess lithium-containing metal compounds can prevent the lithium dendrites from precipitating on the surface of the lithium electrode.

The lithium substrate layer 21 is preferably formed over the entire surface of the current collector 10. Also, the method of forming the lithium substrate layer can be preferably performed by a thin film deposition method. For example, the thin-film deposition method may be a method selected from the group consisting of Chemical Vapor Deposition (CVD), Plasma-Enhanced Chemical Vapor Deposition (PECVD), Sputtering, E-beam evaporation, Thermal evaporation, Laser Molecular Beam Epitaxy (L-MBE), Pulsed Laser Deposition (PLD), and Atomic layer deposition.

The thickness of the lithium substrate layer 21 is 5 μm to 100 μm, preferably 10 μm to 60 μm, and more preferably 20 μm to 40 μm. If the thickness is less than 5 μm, the amount of lithium metal is too small to compensate for long-term cycle reversibility. If the thickness exceeds 100 μm, the energy density becomes too low.

Next, in step ii), the lithium pattern layer 22 may be formed on the lithium substrate layer 21 using the shadow mask 30.

The shadow mask 30 according to the present invention includes an opening 31 for transferring the lithium metal and a frame for supporting the shape of the opening 31. The shape of the opening 31 is not limited, and may include various shapes such as a rectangular shape, a rhombus shape, a circular shape, a stripe shape, a honeycomb shape, and the like. Since the shape of the opening 31 directly matches the shape of the lithium pattern layer 22, the lithium pattern layer 22 has various pattern parts in the shapes of a rectangular shape, a rhombus shape, a circular shape, a stripe shape, a honeycomb shape, and the like. FIGS. 2 to 7 are examples of the patterns applicable to the negative electrode for the lithium secondary battery of the present invention.

The ratio of the area occupied by the opening 31 in the shadow mask 30 can be expressed as a ratio of the openings. It is preferable that the ratio of the openings, which is the ratio of the area occupied by the opening 31, is 20% to 80% based on 100% of the total area of the current collector 10. If the ratio of the opening is less than 20%, the formed lithium pattern layer 22 is not enough to disperse the current density as the transfer passage of lithium. If the ratio of the openings exceeds 80%, since the space occupied by the lithium pattern layer 22 is large and the void for trapping the lithium dendrites is relatively reduced, it is apprehended that the performance of the battery may be deteriorated.

The thickness of the lithium pattern layer 22 is 5 μm to 50 μm, preferably 10 μm to 40 μm, more preferably 20 μm to 30 μm. If the thickness exceeds 50 It, not only the energy density is lowered but also t is difficult to maintain the shape of the pattern due to the pressing at the time of manufacturing the cell. If the thickness is less than 5 μm, it may be insufficient to ensure the effect of current dispersion according to the patterning.

In addition, the thickness ratio of the lithium substrate layer 21 and the lithium pattern layer 22 is preferably 1:3 to 3:1, more preferably 1:2 to 2:1. The lithium electrode having the thickness ratio of the above range maximizes the patterning effect of the lithium metal and is also advantageous in terms of the energy density. Specifically, if the thickness ratio of the lithium substrate layer 21 to the lithium pattern layer 22 is less than 1 or more than 3, since the shape of the patterned lithium is not maintained well during the charging/discharging, the patterned effect cannot be obtained.

The lithium pattern layer 22 may preferably be formed by a thin film deposition method. For example, the thin film deposition method may be a method selected from the group consisting of Chemical Vapor Deposition (CVD), Plasma-Enhanced Chemical Vapor Deposition (PECVD), Sputtering, E-beam evaporation, Thermal evaporation, Laser Molecular Beam Epitaxy (L-MBE), Pulsed Laser Deposition (PLD), and Atomic layer deposition, and the lithium pattern layer 22 may be deposited in the same manner as in the lithium substrate layer 21.

As an example, the current collector 10 on which the lithium substrate layer 21 is formed in advance is placed on the supporting means of the chamber, and then the shadow mask 30 is loaded into the chamber. After the current collector 10 and the shadow mask 30 are aligned, the shadow mask 30 is fixed on the lithium substrate layer 21 of the current collector 10. At this time, the partial region of the lithium substrate layer 21 is exposed by the opening 31 of the shadow mask 130. The lithium pattern layer 22 can be formed by depositing a lithium source at 30 W for 3 minutes to 10 minutes in a vacuum state (10 torr to 3 torr) at room temperature in the chamber.

Thereafter, in step iii), the shadow mask 130 may be removed.

The remaining constitution except for the structure and characteristics of the above-mentioned negative electrode of the lithium secondary battery according to the present invention can be manufactured through a well-known technique practiced by those skilled in the art and will be described in detail below.

The positive electrode according to the present invention may be formed in the form of a positive electrode by forming a film on a positive electrode current collector using a composition including a positive electrode active material, a conductive material, and a binder.

The positive electrode active material may be any one selected from the group consisting of $LiCoO_2$, $LiNiO_2$, $LiMnO_2$, $LiMn_2O_4$, $Li(Ni_aCo_bMn_c)O_2$ ($0<a<1$, $0<b<1$, $0<c<1$, $a+b+c=1$), $LiNi_{1-y}Co_yO_2$, $LiCo_{1-y}Mn_yO_2$, $LiNi_{1-y}Mn_yO_2$ ($0 \leq y<1$), $Li(Ni_aCo_bMn_c)O_4$ ($0<a<2$, $0<b<2$, $0<c<2$, $a+b+c=2$), $LiMn_{2-z}Ni_zO_4$, $LiMn_{2-z}Co_zO_4$ ($0<z<2$), $LiCoPO_4$ and $LiFePO_4$, or a mixture of two or more thereof. Also, in addition to these oxides, sulfides, selenides, halides and the like can also be used. In a more preferred embodiment, the positive electrode active material may be $LiCoO_2$ which is suitable for high power batteries.

The conductive material is a component for further improving the electrical conductivity of the positive electrode active material, and non-limiting examples thereof may be graphites such as natural graphite or artificial graphite; carbon blacks such as carbon black, acetylene black, ketjen black, channel black, furnace black, lamp black, and summer black; conductive fibers such as carbon fiber and metal fiber; metal powders such as carbon fluoride, aluminum and nickel powder; conductive whiskers such as zinc oxide and potassium titanate; conductive metal oxides such as titanium oxide; conductive materials such as polyphenylene derivatives and the like The binder is a component that maintains a positive electrode active material on a positive electrode current collector and has the function of organically connecting between positive electrode active materials, and the examples thereof may include polyvinylidene fluoride (PVDF), polyvinyl alcohol (PVA), carboxymethylcellulose (CMC), starch, hydroxypropyl cellulose, regenerated cellulose, polyvinyl pyrrolidone, tetrafluoroethylene, polyethylene, polypropylene, ethylene-propylene-diene polymer (EPDM), sulfonated-EPDM, styrene-butadiene rubber, fluorine rubber, and various copolymers thereof The positive electrode current collector is the same as described above with respect to the negative electrode current collector, and generally the positive electrode current collector may be an aluminum foil.

The positive electrode composition can be coated on a positive electrode current collector using conventional methods known in the art, and for example, various methods such as dipping method, spraying method, roll court method, gravure printing method, bar court method, die coating method, comma coating method or combinations thereof can be used.

After such a coating process, evaporation of the solvent or dispersion medium, densification of the coating film and adhesion between the coating film and the current collector take place in the positive electrode and positive electrode composition through drying process. At this time, the drying is carried out according to a conventional method and is not particularly limited.

The separator according to the present invention is not particularly limited in its material and is not particularly limited as long as it is commonly used as a separator in an electrochemical device, which physically separates a negative electrode and a positive electrode from each other and has electrolyte and ion permeability. However, it is preferable that the separator is a porous, nonconductive or insulating material, particularly a material with an excellent moisture-containing ability for the electrolyte solution along with a low resistance to the movement of ions in the electrolyte solution. For example, a polyolefin-based porous membrane or nonwoven fabric may be used, but it is not particularly limited thereto.

Examples of the polyolefin-based porous membrane may include a membrane formed by each of polyethylenes such as high density polyethylene, linear low density polyethylene, low density polyethylene and ultrahigh molecular weight polyethylene, and polyolefin-based polymer such as polypropylene, polybutylene and polypentene, etc. or a mixture of these polymers.

The nonwoven fabric may be a nonwoven fabric formed by each of, for example, polyphenylene oxide, polyimide, polyamide, polycarbonate, polyethylene terephthalate, polyethylene naphthalate, polybutylene terephthalate, polyphenylene sulfide, polyacetal, polyether sulfone, polyetheretherketone, polyester, etc., or a mixture of these polymers, in addition to the polyolefin-based nonwoven fabric described above, and these nonwoven fabric includes spunbond or meltblown form consisting of long fibers which is in the form of fibers forming a porous web.

The thickness of the separator is not particularly limited, but is preferably in the range of 1 to 100 μm, more preferably in the range of 5 to 50 μm. When the thickness of the separator is less than 1 μm, the mechanical properties cannot be maintained, and when the thickness of the separator exceeds 100 μm, the separator acts as a resistance layer, thereby deteriorating the performance of the battery.

The pore size and porosity of the separator are not particularly limited, but it is preferable that the pore size is 0.1 to 50 μm and the porosity is 10 to 95%. When the pore size of the separator is less than 0.1 μm or the porosity is less than 10%, the separator acts as a resistive layer. When the pore size of the separator exceeds 50 μm or the porosity exceeds 95%, the mechanical properties cannot be maintained.

The electrolyte applicable to the present invention may be a non-aqueous electrolyte solution, which does not react with lithium metal, or a solid electrolyte, but preferably a non-aqueous electrolyte, and the electrolyte includes an electrolyte salt and an organic solvent.

The electrolyte salt contained in the non-aqueous electrolyte solution is a lithium salt. The lithium salt can be used without limitation as long as it is commonly used in an electrolyte solution for a lithium secondary battery. For example, the anion of the lithium salt may include any one selected from the group consisting of $-F^-$, $Cl^-$, $Br^-$, $I^-NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$, or a combination of two or more of these anions.

The organic solvent contained in the non-aqueous electrolyte solution can be used without limitation as long as it is commonly used in an electrolyte solution for a lithium secondary battery, and for example, ether, esters, amide, linear carbonate, cyclic carbonate and the like may be used alone or in combination of two or more thereof. Among them, carbonate compounds which are typically cyclic carbonate, linear carbonate, or a mixture thereof may be included.

Specific example of the cyclic carbonate compound includes any one selected from the group consisting of ethylene carbonate (EC), propylene carbonate (PC), 1,2-butylene carbonate, 2,3-butylene carbonate, 1,2-pentylene carbonate, 2,3-pentylene carbonate, vinylene carbonate, vinylethylene carbonate and their halide, or a mixture of two or more thereof.

Example of such halides includes, but is not limited to, fluoroethylene carbonate (FEC) and the like.

Also, specific example of the linear carbonate compound may typically include, but are not limited to, any one selected from the group consisting of dimethyl carbonate (LMC), diethyl carbonate (DEC), dipropyl carbonate, ethylmethyl carbonate (EMC), methylpropyl carbonate and ethylpropyl carbonate, or a mixture of two or more thereof.

Particularly, cyclic carbonates such as ethylene carbonate and propylene carbonate among the carbonate-based organic solvents are highly viscous organic solvents and have a high dielectric constant, and thus can dissociate lithium salts in the electrolyte much better. When these cyclic carbonates are mixed with linear carbonates with a low viscosity and a low dielectric constant, such as dimethyl carbonate and diethyl carbonate, at a suitable ratio, an electrolyte solution having the higher electrical conductivity can be prepared.

In addition, the ether among the above organic solvents may be, but is not limited to, any one selected from the group consisting of dimethyl ether, diethyl ether, dipropyl ether, methylethyl ether, methylpropyl ether and ethylpropyl ether, or a mixture of two or more thereof.

In addition, the ester among the above organic solvents may be, but is not limited to, any one selected from the group consisting of methyl acetate, ethyl acetate, propyl acetate, methyl propionate, ethyl propionate, propyl propionate, γ-butyrolactone, γ-valerolactone, γ-caprolactone, σσ-valerolactone and ε-caprolactone, or a mixture of two or more thereof.

The injection of the non-aqueous electrolyte solution can be performed at an appropriate stage during the manufacturing process of the electrochemical device, depending on the manufacturing process and required physical properties of the final product. That is, such injection can be carried out before assembling the electrochemical device or in the final stage of assembling the electrochemical device.

In the case of the lithium secondary battery according to the present invention, it is possible to perform laminating or stacking and folding processes of the separator and the electrode, in addition to the winding process which is a general process.

In addition, the case of the battery may be cylindrical, square, pouch type, coin type, or the like.

As described above, since the lithium secondary battery according to the present invention stably exhibits excellent discharge capacity, output characteristics and capacity retention rate, it is useful in the fields of portable devices such as mobile phones, notebook computers, digital cameras, and electric vehicles such as hybrid electric vehicle (HEV).

Therefore, according to another embodiment of the present invention, a battery module including the lithium secondary battery as a unit cell, and a battery pack including the same are provided. The battery module or the battery pack may be used as a power source for any one or more medium and large-sized devices of a power tool; an electric vehicle including an electric vehicle (EV), a hybrid electric vehicle, and a plug-in hybrid electric vehicle (PHEV); or a power storage system, etc.

Hereinafter, in order to explain the present invention in detail, the present invention will be described in detail with reference to examples and experimental examples, but the present invention is not limited by these examples and experimental examples. The embodiments according to the present invention can be modified into various other forms, and the scope of the present invention should not be construed as being limited to the embodiments described below. Embodiments of the present invention are provided to more fully describe the present invention to those skilled in the art.

Example 1

Patterning of Lithium Using Shadow Mask

A lithium substrate layer was formed by depositing the lithium metal on the Cu foil current collector through a physical vapor deposition (PVD). The lithium substrate layer with a thickness of 10 μm was formed by placing the lithium metal, which is a raw material for the deposition, in a thermal evaporator and evaporating it at 200° C. for 7 hours through thermal evaporation. A lithium pattern layer with a thickness of 10 μm was formed by placing a micro-patterned shadow mask with a width of 100 μm, a length of 100 μm and a thickness of 30 μm on the lithium substrate layer thus obtained, and evaporating at 200° C. for 7 hours. After deposition, the shadow mask was removed. In this way, a lithium electrode including the micro-patterned lithium pattern layer with a thickness of 10 μm, a width of 100 μm and a length of 100 μm was manufactured on the lithium substrate layer with a thickness of 10 μm.

Manufacturing of Lithium Secondary Battery 96 wt. % of $LiCoO_2$ as a positive electrode active material, 2 wt. % of Denka black as an electrical conductive material and 2 wt. % of VdF (Polyvinylidene fluoride) as a binder were added to the solvent of NMP (NMethyl-2-pyrrolidone) to prepare a positive electrode active material slurry. The prepared positive electrode mixture slurry was coated on one side of the aluminum current collector at a thickness of 65 μm, dried and rolled, and then punched to form a positive electrode active material layer.

A coin-type half-cell were prepared by using the patterned lithium electrode obtained above as a counter electrode, interposing the polyolefin separator between the positive electrode and the counter electrode, and then injecting the electrolyte solution which was prepared by dissolving 1 M $LiPF_6$ in the mixed solvent of fluorinated ethylene carbonate (FEC) and dimethyl carbonate (DMC) in a volume ratio of 70:30.

Example 2

A lithium electrode and a lithium secondary battery were manufactured in the same manner as in Example 1, except that the lithium substrate layer was formed to have a thickness of 5 μm and the lithium pattern layer to have a thickness of 15 μm.

Example 3

A lithium electrode and a lithium secondary battery were manufactured in the same manner as in Example 1, except that the lithium substrate layer was formed to have a thickness of 15 μm and the lithium pattern layer to have a thickness of 5 μm.

Example 4

A lithium electrode and a lithium secondary battery were manufactured in the same manner as in Example 1, except that at the time of forming the lithium substrate layer, the substrate layer containing lithium-S alloy layer was formed by evaporating S at 150° C. for 20 minutes to form a 1 μm thick S layer first.

Comparative Example 1

A lithium secondary battery was manufactured in the same manner as in Example 1, except that an untreated lithium foil instead of the patterned lithium electrode of Example 1 was used as a counter electrode.

Comparative Example 2

A lithium electrode and a lithium secondary battery were manufactured in the same manner as in Example 1, except that the lithium substrate layer was formed to have a thickness of 2 μm and the lithium pattern layer to have a thickness of 18 μm.

Comparative Example 3

A lithium electrode and a lithium secondary battery were manufactured in the same manner as in Example 1, except that the lithium substrate layer was formed to have a thickness of 18 μm and the lithium pattern layer to have a thickness of 2 μm.

Comparative Example 4

A lithium electrode and a lithium secondary battery were manufactured in the same manner as in Example 1, except that instead of using the shadow mask at the time of patterning, a polymer film having the same pattern is placed on the lithium metal and pressed through a nip pressure roll press machine to form a lithium pattern layer.

Experimental Example 1

The coin-type half-cell manufactured in Example 1 and Comparative Example 1 was charged and discharged using an electrochemical charge/discharge controller. The charging was performed up to the voltage of 4.4V vs. $Li/Li^+$, the discharging was performed up to the voltage of 3.0V vs. $Li/Li^+$, and the current density was applied at 0.5 C-rate.

The discharge capacity and the charging/discharging efficiency in the 50th cycle in the charging/discharging process of Example 1 and Comparative Example 0.1 are shown in Table 1.

TABLE 1

|  | Thickness of the lithium substrate layer (μm) (A) | Thickness of the lithium pattern layer (μm) (B) | Thickness ratio of lithium substrate layer and lithium pattern layer(A:B) | Note | Discharge capacity after 50 cycles (%) | Charging/discharging efficiency after 50 cycles (%) |
|---|---|---|---|---|---|---|
| Example 1 | 10 | 10 | 1:1 | — | 87 | 93 |
| Example 2 | 5 | 15 | 1:3 | — | 85 | 92 |
| Example 3 | 15 | 5 | 3:1 | — | 84 | 93 |
| Example 4 | 10 | 10 | 1:1 | The lithium substrate layer is a lithium-S alloy layer. | 89 | 94 |

TABLE 1-continued

|  | Thickness of the lithium substrate layer (μm) (A) | Thickness of the lithium pattern layer (μm) (B) | Thickness ratio of lithium substrate layer and lithium pattern layer(A:B) | Note | Discharge capacity after 50 cycles (%) | Charging/ discharging efficiency after 50 cycles (%) |
|---|---|---|---|---|---|---|
| Comparative Example 1 | 10 | — | — | The lithium pattern layer was not formed. | 64 | 83 |
| Comparative Example 2 | 2 | 18 | 1:9 | — | 77 | 87 |
| Comparative Example 3 | 18 | 2 | 9:1 | — | 76 | 85 |
| Comparative Example 4 | 10 | 10 | 1:1 | The patterning is performed through pressing instead of shadow mask. | 69 | 84 |

Referring to Table 1, it can be seen that the discharge capacity after 50 cycles in Example 1 was improved by 20% or more as compared with that of Comparative Example 1. Also, it can be seen that the charging/discharging efficiency after 50 cycles in Example 1 is also improved by about 10% as compared with that of the Comparative Example 1.

The reason why the performance of the patterned lithium electrode through the shadow mask is improved is as follows. As the surface area of patterned lithium metal becomes wider than that of the untreated lithium metal foil, since the current density per unit area is relatively lowered even though the charging/discharging is performed at the same current density, the relatively stable charging/discharging would have been occurred. When the lithium metal secondary battery, which is charging/discharging along with deposition/desorption of lithium on the surface of lithium metal, is charging/discharging at a high current density, as the lithium metal grows and falls off abnormally, the reversibility of the cell is deteriorated and the safety of the cell is seriously affected. However, if the surface area of the lithium metal is increased by the patterning as in the present invention, even when charging/discharging at the same current density, the current density per unit area applied to the surface of the lithium metal may be reduced, thereby suppressing the abnormal growth of lithium metal. The cycle performance would have been improved due to these effects.

Meanwhile, as in Example 4, when a material such as S that can be alloyed with lithium is first formed, a Li—S alloy is formed between the Cu current collector and the lithium metal substrate layer to further improve adhesion to the current collector. As a result, it can be seen that the discharge capacity after 50 cycles and the charging/discharging efficiency after 50 cycles are slightly improved as compared with those of Example 1.

Also, as in Comparative Example 4, since the lithium metal pattern made by pressing a micro-patterned polymer film on the lithium metal through a roll press machine is not uniform in shape, the uniform dispersion of the current density can be suppressed. Accordingly, it can be seen that the discharge capacity after 50 cycles and the charging/ discharging efficiency after 50 cycles are reduced more than those in Example 1.

DESCRIPTION OF SYMBOLS

10: Current collector
20: Lithium electrode
21: Lithium substrate layer
22: Lithium pattern layer
30: Shadow mask
31: Opening

The invention claimed is:

1. A method for manufacturing a negative electrode for a lithium secondary battery comprising the steps of:
   i) forming thin film deposition of a lithium substrate layer on one or both sides of a current collector, wherein the lithium substrate layer has a thickness of 5 μm to 15 μm and the lithium substrate layer consists of lithium sulfur alloy formed by evaporating sulfur, wherein the thin film deposition of the lithium substrate layer is thermal evaporation;
   ii) placing a shadow mask having at least one opening on the lithium substrate layer and forming a lithium pattern layer on the lithium substrate layer through the at least one opening of the shadow mask; and
   iii) removing the shadow mask to expose the lithium pattern layer formed on the lithium substrate layer,
   wherein the thickness ratio of the lithium substrate layer and the lithium pattern layer is 1:2 to 2:1, and
   wherein a ratio of an area occupied by the at least one opening is from 20% to 80% based on 100% of a total area of the current collector.

2. The method for manufacturing the negative electrode for the lithium secondary battery according to claim 1, wherein the current collector is at least one selected from the group consisting of copper, aluminum, stainless steel, zinc, titanium, silver, palladium, nickel, iron, chromium, alloys thereof and combinations thereof.

3. The method for manufacturing the negative electrode for the lithium secondary battery according to claim 1, wherein the lithium substrate layer is formed on one entire surface of the current collector.

4. The method for manufacturing the negative electrode for the lithium secondary battery according to claim 1, wherein the at least one opening is of a rectangular shape, a rhombus shape, a circular shape, a stripe shape, or a honeycomb shape.

5. The method for manufacturing the negative electrode for the lithium secondary battery according to claim 1, wherein the lithium pattern layer includes a pattern part of a rectangular shape, a rhombus shape, a circular shape, a stripe shape, or a honeycomb shape.

6. The method for manufacturing the negative electrode for the lithium secondary battery according to claim 1, wherein the lithium pattern layer has a thickness of 5 μm to 30 μm.

* * * * *